(12) United States Patent
Jeong et al.

(10) Patent No.: US 12,114,526 B2
(45) Date of Patent: Oct. 8, 2024

(54) DISPLAY DEVICE

(71) Applicant: LG Display Co., Ltd., Seoul (KR)

(72) Inventors: Yeonjae Jeong, Paju-si (KR); Wansoo Lee, Goyang-si (KR)

(73) Assignee: LG DISPLAY CO., LTD., Seoul (KR)

( * ) Notice: Subject to any disclaimer, the term of this patent is extended or adjusted under 35 U.S.C. 154(b) by 385 days.

(21) Appl. No.: 17/507,582

(22) Filed: Oct. 21, 2021

(65) Prior Publication Data
US 2022/0181592 A1 Jun. 9, 2022

(30) Foreign Application Priority Data
Dec. 3, 2020 (KR) .................. 10-2020-0167875

(51) Int. Cl.
| | | |
|---|---|---|
| H10K 50/86 | (2023.01) | |
| H10K 50/84 | (2023.01) | |
| H01L 23/00 | (2006.01) | |
| H10K 59/12 | (2023.01) | |
| H10K 77/10 | (2023.01) | |
| H10K 102/00 | (2023.01) | |

(52) U.S. Cl.
CPC ......... *H10K 50/865* (2023.02); *H10K 50/841* (2023.02); *H01L 24/32* (2013.01); *H01L 2224/3207* (2013.01); *H01L 2224/32225* (2013.01); *H10K 59/12* (2023.02); *H10K 77/111* (2023.02); *H10K 2102/311* (2023.02); *H10K 2102/351* (2023.02)

(58) Field of Classification Search
CPC ........ G09F 9/301; H10K 50/865; B25B 5/028
See application file for complete search history.

(56) References Cited

U.S. PATENT DOCUMENTS

| | | | |
|---|---|---|---|
| 2013/0240116 A1* | 9/2013 | Nonaka | B32B 17/06 |
| | | | 156/64 |
| 2016/0002505 A1* | 1/2016 | Mizutani | C09J 133/08 |
| | | | 525/149 |
| 2020/0209387 A1* | 7/2020 | Yeon | G01S 15/04 |
| 2021/0050553 A1* | 2/2021 | Ogawa | B32B 27/36 |

FOREIGN PATENT DOCUMENTS

| | | |
|---|---|---|
| CN | 103237435 A | 8/2013 |
| CN | 203178964 U | 9/2013 |
| CN | 107340943 A | 11/2017 |
| CN | 207096957 U | 3/2018 |

(Continued)

*Primary Examiner* — Moazzam Hossain
(74) *Attorney, Agent, or Firm* — Birch, Stewart, Kolasch & Birch, LLP

(57) ABSTRACT

A display device includes a display panel having a display area and a non-display area surrounding the display area, and a decorative film disposed on the display panel. The decorative film includes a porous layer disposed on the display panel and including a plurality of pores, and a decorative layer which overlaps the non-display area and is disposed in the porous layer. Accordingly, the decorative layer which is partially disposed is formed in the porous layer so that a step caused by the decorative layer is not formed or minimized to reduce the thickness of the decorative film. As a result, the design the display device can be slim, and a flexible display device with an excellent folding reliability can be provided based on the display device.

20 Claims, 10 Drawing Sheets

(56) References Cited

FOREIGN PATENT DOCUMENTS

| | | |
|---|---|---|
| CN | 108155215 A | 6/2018 |
| CN | 108883847 A | 10/2018 |
| CN | 109448542 A | 3/2019 |
| CN | 109782958 A | 5/2019 |
| CN | 110767086 A | 2/2020 |
| CN | 210488190 U | 5/2020 |
| CN | 112002223 A | 11/2020 |
| CN | 115407431 A | 11/2022 |
| JP | 2008-83263 A | 4/2008 |
| KR | 10-2018-0008204 A | 1/2018 |

* cited by examiner

DISPLAY DEVICE

CROSS-REFERENCE TO RELATED APPLICATIONS

This application claims priority to Korean Patent Application No. 10-2020-0167875 filed on Dec. 3, 2020, in the Korean Intellectual Property Office, the entire contents of which are hereby expressly incorporated by reference into the present application.

BACKGROUND

Field

The present disclosure related to a display device, and more particularly, to a display device having a structure in which a step due to a decorative layer partially disposed is not caused or minimized, and to a display device including a decorative film with a reduced thickness and an improved folding reliability.

Description of the Related Art

In an information era, a display field which visually expresses electrical information signals has been rapidly developed. In response to this, various display devices having excellent performances such as thin-thickness, light weight, and low power consumption have been developed. Specific examples of such a display device include a liquid crystal display device (LCD), a plasma display panel device (PDP), a field emission display device (FED), an organic light emitting display device (OLED), and the like.

Recently, a shape or a size of the display device has gradually diversified and in particularly, an interest in a flexible display device which maintains a display performance even though the display device is folded or rolled is consistently increasing.

In the meantime, a decorative film is disposed below a cover member of the display device to suppress the wiring line and circuit of the electrode from being visibly recognized and suppress the light leakage and the decorative film includes a base member and a decorative layer disposed on the base member overlapping the non-display area. As described above, as the decorative layer is formed to overlap only the non-display area, a step can be caused on the base member and the step can be visibly recognized to the user to degrade an appearance quality and degrade a flatness of the decorative film.

Therefore, even though an overcoating layer can be formed on the decorative layer to cover the step, in this case, the thickness of the decorative film can be increased. Further, in order to bond the decorative film to the display panel and the cover member, adhesive layers are disposed on and below the decorative film. Accordingly, the entire thickness of the display device can be increased to degrade the folding characteristic, which can limit implementation of a foldable display device.

SUMMARY OF THE DISCLOSURE

Accordingly, an object to be achieved by the present disclosure is to reduce the thicknesses of not only the decorative film but also the display device with a structure in which a step due to the decorative layer which is partially disposed is not generated or minimized.

Another object to be achieved by the present disclosure is to provide a display device with a reduced folding stress and an improved reliability.

Still another object to be achieved by the present disclosure is to provide a flexible display device which has a reduced radius of curvature and performs both the in-folding and out-folding while maintaining the folding reliability to be high by removing the step caused by the decorative layer.

Objects of the present disclosure are not limited to the above-mentioned objects, and other objects, which are not mentioned above, can be clearly understood by those skilled in the art from the following descriptions.

According to an aspect of the present disclosure, a display device includes a display panel which includes a display area and a non-display area enclosing the display area, and a decorative film disposed on the display panel. The decorative film includes a porous layer disposed on the display panel and including a plurality of pores, and a decorative layer which overlaps the non-display area and is disposed in the porous layer. Accordingly, the decorative layer which is partially disposed is formed in the porous layer so that a step caused by the decorative layer is not generated or minimized to reduce the thickness of the decorative film and design the display device to be slim.

Other detailed matters of the exemplary embodiments are included in the detailed description and the drawings.

According to the present disclosure, a porous layer which can absorb a composition for forming a decorative layer is used as a base member to dispose the decorative layer in the porous layer so that a structure in which the step caused by the decorative layer is not generated or minimized can be provided. By doing this, the thickness of the decorative film can be reduced to provide a display device with a reduced thickness.

Further, the irregularity of the folding stress due to the step is improved to provide a display device with a folding reliability which can be significantly improved.

Further, as the folding reliability is improved, a foldable display device with a smaller radius of curvature is implemented while maintaining the folding characteristic to be high and further, a multi-foldable display device which is capable of being in-folded and out-folded can be implemented.

Further, the step caused by the decorative layer is not generated or minimized so that the thickness of the adhesive layer can be reduced. Furthermore, an adhesive layer having a modulus higher than that of an adhesive which has been used for the flexible display device of the related art is used while maintaining the folding characteristic to be high to achieve an advantage for the process and save the process cost.

The effects according to the present disclosure are not limited to the contents exemplified above, and more various effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION OF THE EMBODIMENTS

Figure 1:
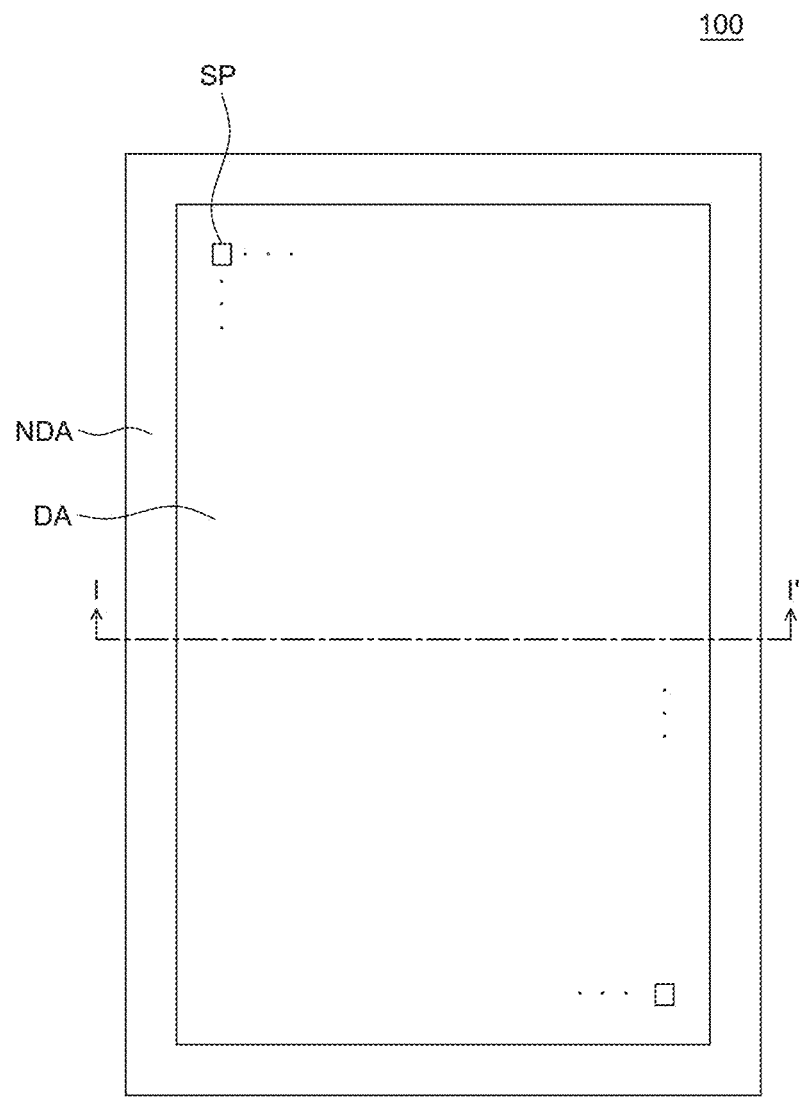
FIG. 1 is a schematic plan view of a display device according to an exemplary embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular can include plural unless expressly stated otherwise.

Components are interpreted to include an ordinary error range even if not expressly stated.

When the position relation between two parts is described using the terms such as "on", "above", "below", and "next", one or more parts can be positioned between the two parts unless the terms are used with the term "immediately" or "directly".

When an element or layer is disposed "on" another element or layer, another layer or another element can be interposed directly on the other element or therebetween.

Although the terms "first", "second", and the like are used for describing various components, these components are not confined by these terms. These terms are merely used for distinguishing one component from the other components, and may not define order. Therefore, a first component to be mentioned below can be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, a display device according to exemplary embodiments of the present disclosure will be described in detail with reference to accompanying drawings. All the components of each display device according to all embodiments of the present disclosure are operatively coupled and configured.

Figure 2:
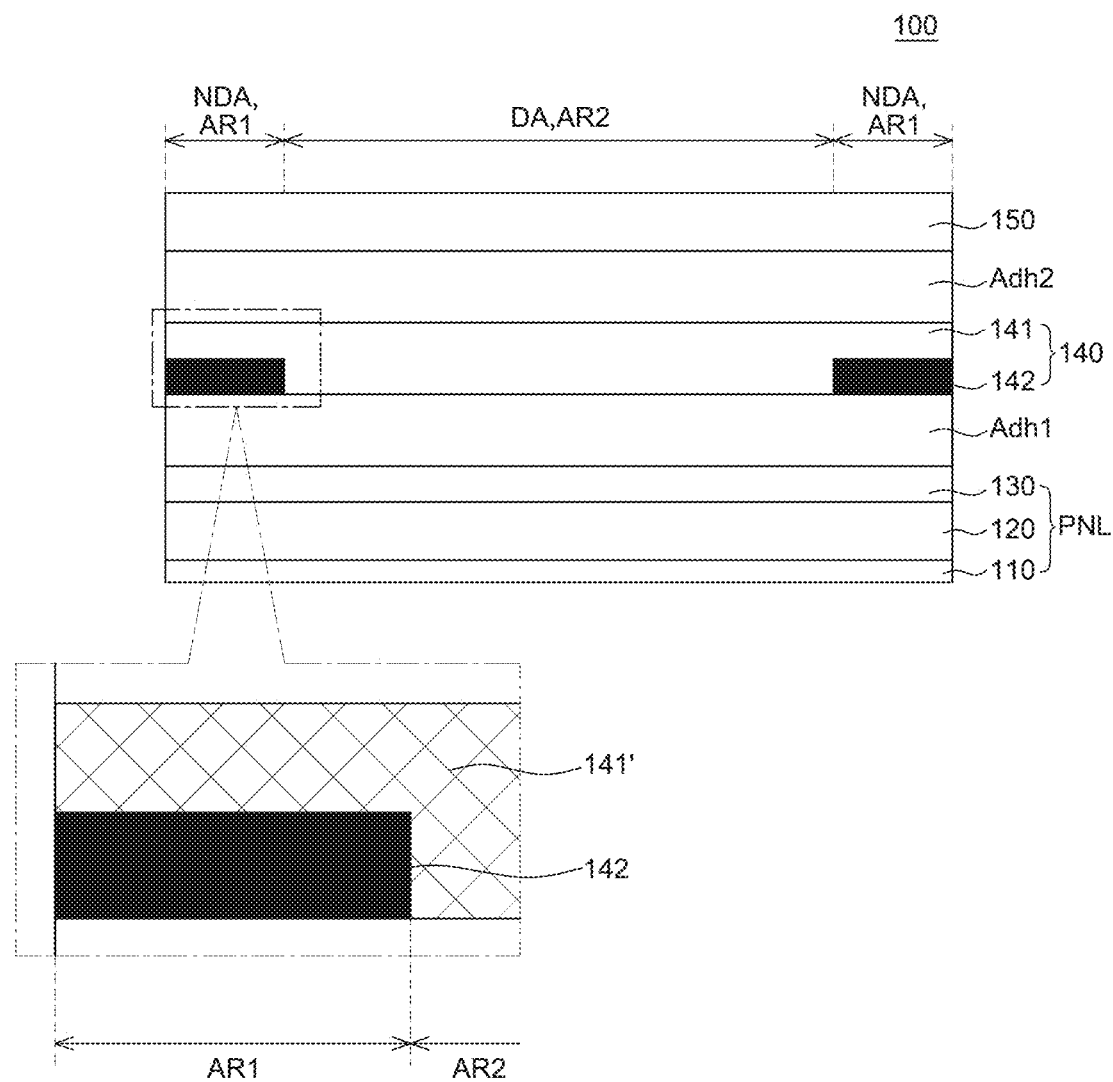
FIG. 2 is a schematic cross-sectional view taken along the line I-I' of FIG. 1.

FIG. 1 is a schematic plan view of a display device according to an exemplary embodiment of the present disclosure. FIG. 2 is a schematic cross-sectional view taken along the line I-I' of FIG. 1.

Referring to FIGS. 1 and 2, the display device according to the exemplary embodiment of the present disclosure includes a display panel PNL, a first adhesive layer Adh1, a decorative film 140, a second adhesive layer Adh2, and a cover member 150. Hereinafter, for the convenience of description, the display device according to the exemplary embodiment of the present disclosure is assumed as an organic light emitting display device, but it is not limited thereto.

The display panel PNL is divided into a display area DA and a non-display area NDA. The display area DA is an area where a plurality of pixels is disposed to substantially display images. In the display area DA, pixels including an emission area for displaying images and a driving circuit for driving the pixels can be disposed. The pixel can include a plurality of sub pixels SP. The sub pixel SP is a minimum unit which configures the display area DA and each sub pixel SP can be configured to emit light of a specific wavelength band. For example, each of the sub pixels SP can be configured to emit red light, green light, blue light, or white light. The non-display area NDA is disposed so as to enclose the display area DA. The non-display area NDA is an area where images are not substantially displayed and various wiring lines, driving ICs, printed circuit boards, and the like for driving the pixels and the driving circuits disposed in the display area DA are disposed.

The display panel PNL includes a substrate 110, an organic light emitting diode 120, and an optical control layer 130.

The substrate 110 supports various elements which configure the display panel PNL. The substrate 110 can be a plastic substrate having a flexibility. For example, the plastic substrate can be selected from polyimide, polyamideimide, polyethersulfone, polyethylene terephthalate, and polycarbonate, but is not limited thereto. The plastic substrate has a relatively weak barrier characteristic against moisture or oxygen so that in order to compensate therefor, the plastic substrate can have a structure in which a plastic film and an inorganic film are laminated. For example, the flexible substrate can have a multi-layered structure in which a first plastic film, an inorganic film, and a second plastic film are sequentially laminated, but is not limited thereto.

The plastic substrate has a thin thickness and has a lower rigidity than that of a glass substrate or a metal substrate so that it is difficult to constantly maintain a shape and when the display device 100 is folded, the plastic substrate can be sagged. In order to compensate therefor, a back plate can be disposed below the display panel PNL. For example, the back plate can be a metal material such as stainless steel (SUS) or Invar and can be formed of a plastic material such as polymethylmetacrylate (PMMA), polycarbonate (PC), polyvinylalcohol (PVA), acrylonitrile-butadiene-styrene (ABS), polyethylene terephthalate (PET), silicone, or polyurethane (PU).

A driving thin film transistor for driving the organic light emitting diode 120 is disposed on the substrate 110. The driving thin film transistor can be disposed in each of the plurality of pixel areas. For example, the driving thin film transistor includes a gate electrode, an active layer, a source electrode, and a drain electrode. Further, the driving thin film transistor can further include a gate insulating layer which insulates the gate electrode from the active layer and an interlayer insulating layer which insulates the gate electrode from the source electrode and the drain electrode.

A planarization layer can be disposed on the driving thin film transistor to planarize an upper surface.

The organic light emitting diode 120 can be disposed on the planarization layer. The organic light emitting diode 120 can include an anode, a cathode, and an organic light emitting layer disposed therebetween. In the organic light emitting diode 120, holes injected from the anode and electrons injected from the cathode are coupled on the organic light emitting layer to emit light. Images are displayed using the light emitted as described above.

The optical control layer 130 is disposed on the organic light emitting diode 120. The optical control layer 130 uniformly transmits light to the outside of the display panel PNL without degrading the luminance of the light emitted from the organic light emitting diode 120 and absorbs or reflects external light to improve a display quality. For example, the optical control layer 130 can be a polarizing plate.

The decorative film 140 is disposed on the display panel PNL. The decorative film 140 does not allow the components such as a wiring line disposed in the non-display area NDA to be visibly recognized by the user, suppresses the light leakage, and protects the display panel PNL from the external impact.

The decorative film 140 includes a porous layer 141 and a decorative layer 142.

The porous layer 141 is disposed on the display panel PNL. The porous layer 141 can be a base member on which the decorative layer 142 is formed. The porous layer 141 is divided into a first area AR1 and a second area AR2. The first area AR1 corresponds to the non-display area NDA and the second area AR2 corresponds to the display area DA. The first area AR1 can be formed to have a width which is substantially the same as the non-display area NDA and if necessary, can be formed to have a width larger than or smaller than that of the non-display area NDA.

The porous layer 141 is formed of a polymer which is flexible and transparent. For example, the porous layer 141 can be formed of one or more polymers selected from polyethylene terephthalate, polyimide, polyamideimide, polycarbonate, polymethyl methacrylate, and cycloolefin (co)polymer. Desirably, the porous layer 141 can include polyethylene terephthalate, which is inexpensive, and is easily obtained, and does not affect the optical characteristic of the display device 100.

For example, a thickness of the porous layer 141 can be 10 µm to 200 µm, or 30 µm to 100 µm. Within this range, a buffering characteristic is excellent so that the damage of the display panel PNL caused from the external impact is suppressed and the folding characteristic is excellent.

The porous layer 141 includes a plurality of pores. The porous layer 141 includes the plurality of pores to have an absorbability and the porous layer 141 is used as a base member for forming the decorative layer 142 to compensate for the step caused by the decorative layer 142.

For example, the porous layer 141 can be a mesh pattern layer, a foam layer, a woven layer, or a non-woven layer which is formed of one or more polymers selected from polyethylene terephthalate, polyimide, polyamideimide, polycarbonate, polymethyl methacrylate, and cycloolefin (co)polymer. The plurality of pores is included therein to absorb an ink for forming the decorative layer. This will be described below in more detail.

The porous layer 141 can be formed as a single layer and can be formed with a multi-layered structure if necessary. For example, the porous layer 141 can be formed with a multi-layered structure in which a plurality of layers formed of one layer selected from the mesh pattern layer, the foam layer, the woven layer, and the non-woven layer is laminated or two or more layers of the mesh pattern layer, the foam layer, the woven layer, and the non-woven layer are laminated.

For example, the porous layer 141 can have an average porosity of 20 volume % to 80 volume %. Within this range, the absorbability and the mechanical strength of the porous layer 141 are excellent. When the average porosity is less than 20 volume %, the composition for forming the decorative layer is not well absorbed in the porous layer so that the step compensation effect can be insignificant. Further, when the average porosity exceeds 80 volume %, a mechanical strength of the porous layer is low so that impact resistance of the decorative film can be degraded.

For example, an average diameter of the plurality of pores can be 0.01 µm to 50 µm. Within this range, it is advantageous in that the composition for forming the decorative layer is easily absorbed and the mechanical property is high. When the average diameter of the pores is less than 0.01 µm, the absorbability of the porous layer 141 is deteriorated so that the step compensation effect can be insignificant. Further, when an average diameter of the pores exceeds 50 µm, the mechanical strength is not satisfied. Further, when the decorative layer 142 is formed, a composition for forming the decorative layer easily spreads to the second area AR2 of the porous layer 141 so that it can be difficult to form the decorative layer 142 restrictively in the first area AR1, for example, the non-display area NDA.

Further, the porous layer 141 has a large surface area to improve an interfacial adhesiveness with the decorative layer 142 and further improve an interfacial adhesiveness with the first adhesive layer Adh1 and the second adhesive layer Adh2. By doing this, the slip between components during the folding can be minimized and separation and tearing defects are improved. Further, the porous layer 141 includes a plurality of pores to effectively alleviate a stress due to the folding. Therefore, the folding reliability is improved to easily implement a foldable display device. Further, a foldable display device having a smaller radius of curvature as compared with the related art can be implemented. Moreover, both an out-folding method to fold the display device to expose a top surface of the display device, for example, the display surface to the outside and an in-folding method to fold the display device to expose the bottom surface of the display device to the outside can be applicable so that a multi-foldable display device can be also implemented.

The decorative layer 142 is disposed in the first area AR1 of the porous layer 141. For example, the decorative layer 142 is disposed so as to overlap the non-display area NDA. The decorative layer 142 does not allow various wiring lines and the driving ICs disposed in the non-display area of the display panel PNL to be visibly recognized and blocks the light leakage. Therefore, the decorative layer 142 can also be referred to as a light shielding layer or a black matrix.

The decorative layer 142 can be formed of a black material having a high light shielding property so that various wiring lines disposed in the non-display area NDA is not visibly recognized to the user. However, it is not limited thereto and if necessary, it can be formed with various colors such as white, red, blue, or green. Further, the decorative layer 142 can be formed of a double layered structure in which decorative layers having different colors are laminated. Further, the decorative layer 142 can include a pattern indicating a logo, a trademark, or a text for identifying the display device 100.

For example, the decorative layer 142 can be formed by printing a composition for forming a decorative layer including a light-absorbing material, a binder, and a curing agent on the porous layer 141 and then photocuring the composition.

For example, the light-absorbing material can be selected from an inorganic light-absorbing material including a carbon black, a titanium black (TiNxOy), and a Cu—Mn—Fe-based black pigment, or an organic light-absorbing material such as lactam black, a perylene black, and an aniline black.

For example, the binder can be one or more selected from an acrylate-based binder, an epoxy-based binder, and a siloxane-based binder.

For example, the composition for forming the decorative layer can be printed on the porous layer 141 by the screen printing or inkjet printing method.

Further, if necessary, printing is performed two or more times to form the decorative layer 142. For example, when the screen printing method is used, it is difficult to form the decorative layer 142 with a desired thickness by one printing process and it can be difficult to achieve a desired optical density value. Further, the printing is not partially performed so that a pinhole defect can be caused. Therefore, it is desirable to form the decorative layer 142 by performing the printing two or more times.

For example, an optical density of the decorative layer 142 is desirably 5 or higher and in this case, the component such as the wiring lines disposed in the non-display area NDA is not visibly recognized to the user and the light leakage can be effectively suppressed.

For example, a thickness of the decorative layer 142 can be 1 μm to 20 μm, or 4 μm to 10 μm. However, the present disclosure is not limited thereto and the thickness of the decorative layer 142 is adjusted in accordance with an optical density of the composition for forming the decorative layer. For example, when the optical density of the composition for forming the decorative layer is 1.6 per 1 μm, the decorative layer 142 can be formed to have a thickness of 4 μm or larger and when the optical density of the composition for forming the decorative layer is 1 per 1 μm, the decorative layer 142 can be formed to have a thickness of 5 μm or larger.

Further, the thickness of the decorative layer 142 can vary depending on a type of the display device 100. For example, when the display device is implemented as a flat panel display device, the thickness of the decorative layer 142 can be 10 μm or larger, and when the display device is implemented as a foldable display device, the thickness of the decorative layer 142 can be 4 μm to 5 μm to be thin to ensure the folding reliability.

In the meantime, even though in FIG. 2, it is illustrated that the decorative layer 142 is in contact with the lower surface of the porous layer 141 and is spaced apart from the upper surface of the decorative layer 142, it is not limited thereto. The decorative layer 142 can be formed to be in contact with the upper surface of the porous layer 141 and be spaced apart from the lower surface of the decorative layer 142. Further, the decorative layer 142 can be formed to have the same thickness as the porous layer 141.

As described above, the porous layer 141 includes the plurality of pores to have an absorbability and the porous layer 141 is used as a base member for forming the decorative layer 142 to compensate for the step caused by the decorative layer 142.

Hereinafter, the step compensation effect will be described in more detail with reference to an enlarged cross-sectional view of the decorative film 140 illustrated in FIG. 2.

The decorative layer 142 is disposed in the first area AR1 of the porous layer 141.

For example, the porous layer 141 can be a non-woven layer 141' formed of one or more polymers selected from polyethylene terephthalate, polyimide, polyamideimide, polycarbonate, polymethyl methacrylate, cycloolefin (co) polymer, and cycloolefin polymer. The non-woven layer 141' can be referred to as a polymer web or a non-woven web.

For example, the non-woven layer 141' can be formed of fibers of the polymer mentioned above. The non-woven layer 141' can be formed as a single layer, for example, a film formed by randomly entangling fibers formed by spinning a polymer.

Specifically, the non-woven layer 141' can be formed of fibers formed by spinning the above-mentioned polymers using a method selected from electro-spinning, electro-blowing, melt-blown spinning, flash spinning, or the like.

For example, the non-woven layer 141' can be formed with a fiber having an average diameter of 0.01 μm to 50 μm or 0.01 μm to 10 μm, but is not limited thereto. However, when the average diameter of the fiber is too large, an average porosity of the non-woven layer 141' is lowered so that the absorbability can be deteriorated.

The non-woven layer 141' formed by a plurality of entangled fibers includes a plurality of pores. Therefore, when the decorative layer 142 is formed, the composition for forming the decorative layer permeates into the first area AR1 of the non-woven layer 141' to be absorbed. For example, when the composition for forming the decorative layer is printed using the non-woven layer 141' as a base member, the composition for forming the decorative layer is immersed in the first area AR1 of the non-woven layer 141'. At this time, a depth of the composition for forming the decorative layer which is absorbed into the non-woven layer 141' can be adjusted in accordance with a viscosity of the composition for forming the decorative layer.

When the composition for forming the decorative layer is immersed into the non-woven layer 141' and then cured, the decorative layer 142 is formed in the non-woven layer 141'. For example, the decorative layer 142 is formed to be filled in the plurality of pores of the first area AR1 of the non-woven layer 141'. Therefore, the decorative layer 142 is formed without causing a step. The thickness of the decorative layer 142 is determined by a depth that the composition for forming the decorative layer is absorbed into the non-woven layer 141'.

A base film such as polyethylene terephthalate which has been mainly used as a base member for forming a decorative layer of the related art does not have the porosity. Therefore, the decorative layer is formed on one surface of the base film to cause the step. When the decorative layer has a large thickness, the step is recognized to the user to degrade the appearance quality and deteriorate the flatness so that the folding reliability is not satisfied due to the irregular stress during the folding. Therefore, it is restricted to implement a foldable display device.

Therefore, in order to compensate for the step, a method for increasing a thickness of the adhesive layer disposed on the decorative layer or further disposing an overcoating layer to make the upper surface of the decorative layer flat has been proposed. However, in this case, the thickness of the display device is increased to increase a stress applied to the display device during the folding and thus a crack is caused in the display panel and the moisture enters through the crack so that a display quality is degraded.

In the meantime, when the thickness of the decorative layer is minimized to solve the problem caused by the step and the increased thickness, there can be another problem in that the optical density is lowered so that the light leakage suppressing effect is lowered. Further, when the thickness of the overcoating layer and/or the adhesive layer is minimized, the step due to the decorative layer is not sufficiently covered so that the flatness is deteriorated and bubbles are generated in the step. Therefore, the separation is easily caused during the folding.

In the display device 100 according to the present disclosure, the porous layer 141 is used as a base member so that the composition for forming the decorative layer is absorbed in the porous layer 141 and then cured to fill the decorative layer 141 in the porous layer 141, for example, between the plurality of pores included in the porous layer 141. Therefore, the decorative layer 142 is formed on the base member without causing a step so that the appearance quality is improved and the entire thickness of not only the decorative layer 140, but also the display device 100 is reduced. Therefore, the irregularity of the stress during the folding is reduced to significantly improve the folding reliability.

The cover member 150 is disposed on the decorative film 140. The cover member 150 protects the display device 100 from the external impact and scratches. Therefore, the cover member 150 can be formed of a material which is transparent and has excellent impact resistance and scratch resistance.

For example, the cover member 150 can be a thin tempered glass. In order to implement a foldable display device, the polymer film can be used as the cover member 150. For example, the polymer film can be a film including a polymer, such as polyimide, polyamideimide, polyethylene terephthalate, polymethyl methacrylate, polypropylene glycol, and polycarbonate. As another example, the polymer film can be a photoisotropic polymer film such as cycloolefin (co) polymer, photoisotropic polycarbonate, or photoisotropic polymethyl methacrylate.

The decorative film 140 is disposed between the display panel PNL and the cover member 150. The first adhesive layer Adh1 is disposed between the decorative film 140 and the display panel PNL and the second adhesive layer Adh2 is disposed between the decorative film 140 and the cover member 150. The first adhesive layer Adh1 bonds the decorative film 140 onto the display panel PNL and the second adhesive layer Adh2 bonds the decorative film 140 to the cover member 150.

The first adhesive layer Adh1 and the second adhesive layer Adh2 can be an optical clear adhesive, an optical clear resin, or a pressure sensitive adhesive, but is not limited thereto.

The porous layer 141 includes a plurality of pores to have a large surface area. Therefore, the interfacial adhesiveness with the adhesive layer as compared with the related art is more advantageous. For example, the porous layer 141 has a large area which is in contact with the first adhesive layer Adh1 and the second adhesive layer Adh2 to have an excellent interfacial adhesiveness and minimize the crack or the separation generated during the folding.

In the meantime, unlike solid or semi-solid adhesives, a liquid adhesive has a low viscosity. Therefore, as the liquid adhesive is used, during the process of bonding the decorative film 140, a part of the first adhesive layer Adh1 and the second adhesive layer Adh2 can be absorbed in the porous layer 141. For example, during the process of bonding the decorative film 140 onto the display panel PNL, the adhesive permeates into the porous layer 141 so that the first adhesive layer Adh1 can be filled in the plurality of pores of the porous layer 141 adjacent to the first adhesive layer Adh1. Further, during the process of bonding the decorative film 140 onto the cover member 150, the adhesive permeates into the porous layer 141 so that the second adhesive layer Adh2 can be filled in the plurality of pores of the porous layer 141 adjacent to the second adhesive layer Adh2.

As described above, when the first adhesive layer Adh1 and the second adhesive layer Adh2 are filled in the plurality of pores of the porous layer 141, a refractive index matches so that the optical characteristic of the decorative film 140 is excellent. Further, the interfacial adhesiveness is improved by the larger surface area of the porous layer 141 so that the interlayer separation or slip due to the folding can be minimized. Further, as the interfacial adhesive is improved, even though the thicknesses of the adhesive layers Adh1 and Adh2 are small, the adhesiveness is maintained to be high so that the thickness of the display device 100 can be designed to be slimmer. By doing this, the folding reliability can be further improved.

Further, the higher the modulus, the better the adhesiveness of the adhesive layers, but the lower the folding characteristic and the restoring force. Therefore, in the related art, in order to implement a flexible, and further foldable display device, the adhesive layer is formed using an adhesive having a low modulus to satisfy the folding reliability. However, in this case, it is not easy to handle the adhesive due to the low modulus and the residual adhesive which is generated during the process is increased, which degrades the process efficiency and increases the process cost.

According to the present disclosure, the step of the decorative film 140 is removed and the thickness of the decorative film 140 and the display device 100 is minimized so that the folding reliability which is equal to or higher than that of the foldable display device of the related art can be obtained while maintaining the modulus of the adhesive layer to be high. For example, according to the present disclosure, a range of the modulus of the available adhesive layer is expanded and the process efficiency is improved by using the adhesive having a higher modulus than that of the related art while maintaining the folding characteristic to be high.

For example, moduli of the first adhesive layer Adh1 and the second adhesive layer Adh2 can be $1.0 \times 10^3$ Pa to $1.0 \times 10^7$ Pa, respectively. In the foldable display device of the related art, in order to satisfy the folding reliability, an adhesive member having a level of a modulus of $1.0 \times 10^3$ Pa to $1.0 \times 10^6$ Pa. In contrast, even though the display device 100 of the present disclosure uses the adhesive layers Adh1 and Adh2 having a higher modulus of $1.0 \times 10^4$ Pa to $1.0 \times 10^7$ Pa, the adhesiveness and the process efficiency can be improved while satisfying the folding reliability.

Hereinafter, a display device according to another exemplary embodiment of the present disclosure will be described with reference to FIG. 3.

Figure 3:
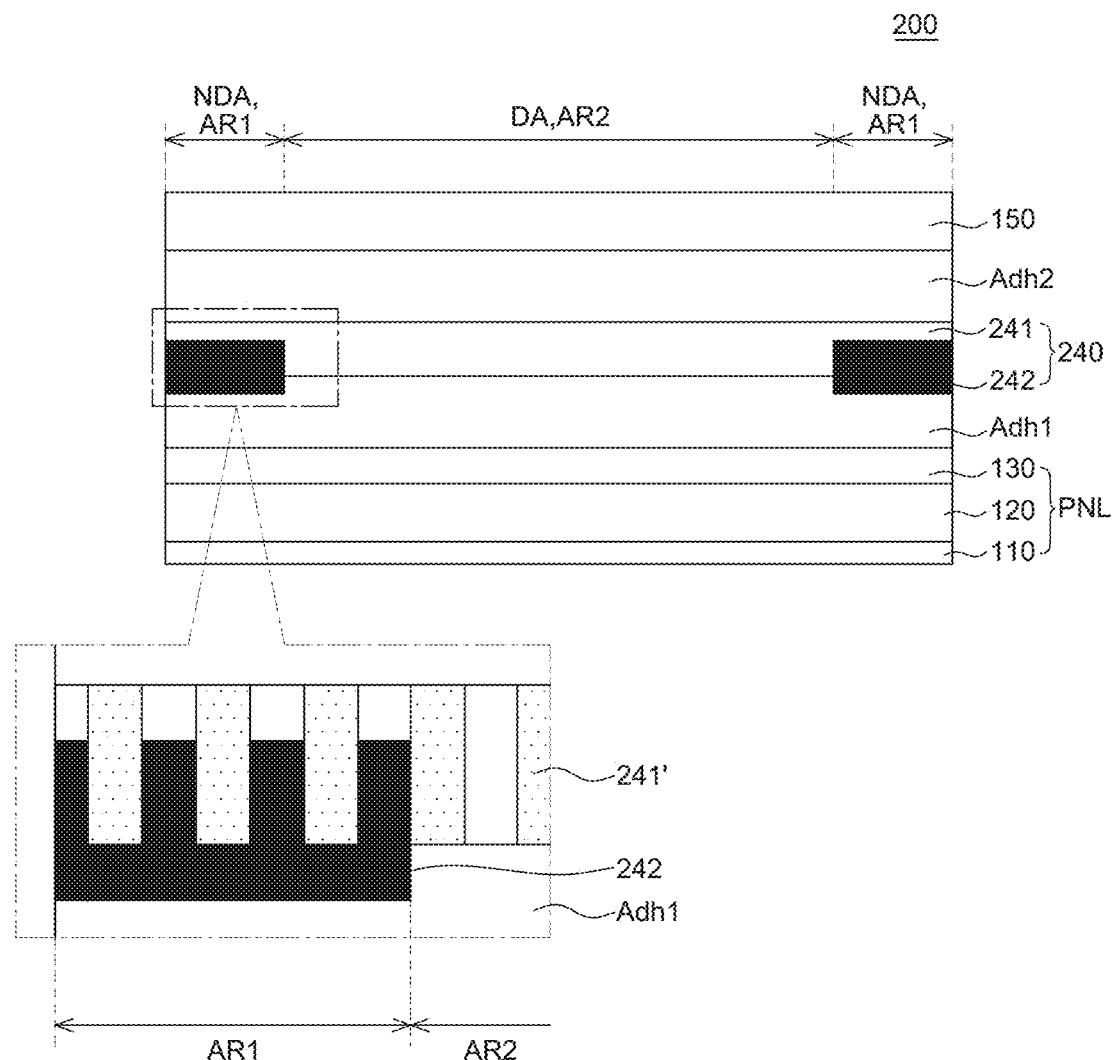
FIG. 3 is a schematic cross-sectional view of a display device according to another exemplary embodiment of the present disclosure.

FIG. 3 is a schematic cross-sectional view of a display device according to another exemplary embodiment of the present disclosure.

Referring to FIG. 3, a display device 200 according to another exemplary embodiment of the present disclosure includes a display panel PNL, a first adhesive layer Adh1, a decorative film 240, a second adhesive layer Adh2, and a cover member 150. The decorative film 240 includes a porous layer 241 and a decorative layer 242. The display device 200 illustrated in FIG. 3 is substantially the same as the display device illustrated in FIGS. 1 and 2 except that the porous layer 241 is a mesh pattern layer 241' and the placement structure of the decorative layer 242 and the first adhesive Adh1 is different, so that a redundant description will be omitted or may be briefly provided.

Referring to FIG. 3, the porous layer 241 can be a mesh pattern layer 241' formed of a polymer. The mesh pattern layer 241' can be a structure in which a plurality of openings is regularly formed like a network. At this time, dimeters of the plurality of openings can be equal to each other or different from each other. Further, the opening can have various shapes such as a circle, an oval, a rectangle, and a rhombus. If the shape of the opening does not degrade the mechanical property of the decorative film 240 and does not cause a problem to absorb the composition for forming the decorative layer, the shape of the opening is not specifically limited.

For example, the mesh pattern layer 241' can be formed of one or more polymers selected from polyethylene terephthalate, polyimide, polyamideimide, polycarbonate, polymethyl methacrylate, and cycloolefin (co)polymer.

For example, the mesh pattern layer 241' can be manufactured by the laser patterning method. For example, the mesh pattern layer 241' is manufactured by manufacturing the film using the above-mentioned polymer and then irradiating the laser beam to form a perforation hole.

For example, a mesh size of the mesh pattern layer 241' can be 270 mesh to 800 mesh. When the mesh size exceeds 800 mesh, it is difficult to manufacture the mesh pattern layer due to the process reason. Further, when the mesh size is lower than 270 mesh, the composition for forming the decorative layer can be absorbed deeper than the desired depth or can be absorbed in the second area AR2 beyond the first area AR1. In consideration of the process problem, the mesh size of the mesh pattern layer 241' can be desirably 270 mesh to 800 mesh.

At this time, the mesh size follows a standard specified in ASTM E11. For example, according to ASTM E11, when the mesh size is 270 mesh, a diameter of the opening is 53 µm.

When the mesh pattern layer 241' is included in the porous layer 241, the composition for forming the decorative layer is absorbed into the pores of the mesh pattern layer 241' so that the decorative layer 242 is disposed in the mesh pattern layer 241'. Therefore, the step of the decorative film 240 and the thickness of the display device 200 can be minimized.

Unlike the non-woven layer 141' illustrated in FIG. 2, in the mesh pattern layer 241', pores are formed to completely straightly pass through the porous layer 241 on the cross-sectional view. For example, the mesh pattern layer 241' has a structure in which pattern units and open units are alternately disposed. Therefore, the light leakage can be generated through the open unit. In order to suppress the light leakage, the decorative layer 242 can be formed to be filled in the plurality of pores formed in the first area AR1 of the mesh pattern layer 241' and cover a surface corresponding to the first area AR1. For example, the decorative layer 242 is disposed over a lower surface of the mesh pattern layer 241' and a part of an upper surface of the first adhesive layer Adh1. The decorative layer 242 is disposed on the surface of the mesh pattern layer 241' to partially cause a step, but the degree of the step is significantly reduced as compared with the related art. Therefore, the step can be easily covered only by the first adhesive layer Adh1 without disposing a separate overcoating layer. Accordingly, the step and the thickness are reduced to improve the folding reliability and easily implement the foldable display device.

In the meantime, according to still another exemplary embodiment of the present disclosure, the porous layer can be a foam layer or a woven layer including a plurality of pores.

First, the foam layer can be a sponge type structure in which the plurality of pores is formed inside and outside of the polymer film.

For example, the foam layer can be a foaming foam formed of one or more polymers selected from polyethylene terephthalate, polyimide, polyamideimide, polycarbonate, polymethyl methacrylate, and cycloolefin (co)polymer.

For example, the foam layer can be a foaming foam in which a foaming agent is added to the polymer and a plurality of pores is formed by a gas generated by a chemical reaction of the foaming agent and the polymer component. As another example, the foam layer can be a foaming foam in which the foaming agent expands by an external energy such as heat to form the plurality of pores.

When the porous layer is a foam layer, the composition for forming the decorative layer is absorbed in the pores at the inside and outside of the foam layer so that the decorative layer is formed in the foam layer. Therefore, the step and the thickness of the decorative film are minimized so that the folding reliability of the display device can be improved.

The woven layer can be formed of a fiber of a polymer selected from polyethylene terephthalate, polyimide, polyamideimide, polycarbonate, polymethyl methacrylate, or cycloolefin (co)polymer. The non-woven layer is one layer formed by the randomly entangled polymer fibers and the woven layer can be formed by regularly weaving polymer fibers.

Specifically, the woven layer can be formed of a woven structure by intersecting and weaving polymer fibers divided into vertical (warp) and horizontal (weft) threads. The woven layer formed as described above has a regular structure as compared with the non-woven layer.

For example, the woven layer can be formed with a fiber having an average diameter of 0.01 µm to 50 µm or 1 µm to 30 µm, but is not limited thereto.

The woven layer includes a plurality of pores by weaving a plurality of vertical threads and a plurality of horizontal threads to be intersected with a space therebetween to have an absorbability. Therefore, the composition for forming the decorative layer is absorbed in the woven layer so that the decorative layer can be formed in the woven layer. Therefore, the step and the thickness of the decorative film are minimized so that the folding reliability of the display device can be improved.

Figure 4:
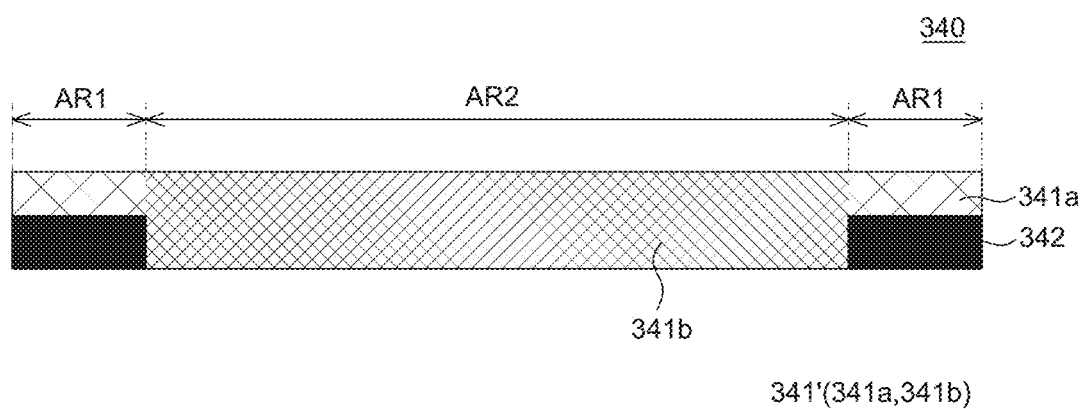
FIG. 4 is a schematic cross-sectional view of a decorative film of a display device according to still another exemplary embodiment of the present disclosure.

FIG. 4 is a schematic enlarged cross-sectional view of a decorative film of a display device according to still another exemplary embodiment of the present disclosure.

Referring to FIG. 4, a decorative film 340 of a display device according to still another exemplary embodiment of the present disclosure includes a non-woven layer 341' and a decorative layer 342. Components of the display device according to still another exemplary embodiment of the present disclosure are substantially the same as the display device 100 illustrates in FIGS. 1 and 2 except for a non-woven layer 341', so that a redundant description will be omitted or may be briefly provided. Further, for the convenience of description, in FIG. 4, the display panel, the first adhesive layer, the second adhesive layer, and the cover member other than the decorative film 340 are not illustrated.

In the display device according to another exemplary embodiment of the present disclosure, the porous layer can be a non-woven layer 341' formed of one or more polymers selected from polyethylene terephthalate, polyimide, polyamideimide, polycarbonate, polymethyl methacrylate, and cycloolefin (co)polymer.

The non-woven layer 341' is divided into a first area AR1 and a second area AR2. The first area AR1 corresponds to the non-display area NDA of the display panel and the second area AR2 corresponds to the display area DA of the display panel.

In the first area AR1, the composition for forming the decorative layer is absorbed to form the decorative layer 342. Therefore, the first area AR1 can be formed to have a structure having an absorbability larger than that of the second area AR2 to easily absorb the composition for forming the decorative layer.

For example, the non-woven layer 341' includes a first non-woven layer 341a corresponding to the first area AR1 and a second non-woven layer 341b corresponding to the second area AR2.

An average diameter of the plurality of pores included in the first non-woven layer 341a can be larger than an average diameter of the plurality of pores formed in the second non-woven layer 341b. In this case, the composition for forming the decorative layer is quickly absorbed in the first area AR1. Further, the plurality of pores formed in the second area AR2 has a small size so that the flowing of the composition for forming the decorative layer from the first area AR1 to the second area AR2 can be suppressed. By doing this, the pattern precision of the decorative layer can be improved.

As another example, an average porosity of the first non-woven layer 341a can be larger than an average porosity of the second non-woven layer 341b. In this case, as described above, the composition for forming the decorative layer is easily absorbed in the first area AR1 and the spreading of the composition for forming the decorative layer to the second area AR2 can be suppressed. By doing this, the pattern precision of the decorative layer 342 can be improved.

When the composition for forming the decorative layer spreads to flow into the second area AR2, the decorative layer blocks a part of the display area, which can degrade the display quality and the appearance quality.

However, as illustrated in FIG. 4, when the size and/or the porosity of the plurality of pores of the first area AR1 are formed to be larger than those of the second area AR2 to give a difference of the porous density for every area, the composition for forming the decorative layer is quickly absorbed in the first area AR1. Further, the composition for forming the decorative layer does not spread to the second area AR2 so that the decorative layer 342 can be formed in the first area AR1 with a uniform thickness. Therefore, the folding reliability is improved and the display quality and the appearance characteristic are excellent.

Figure 5:
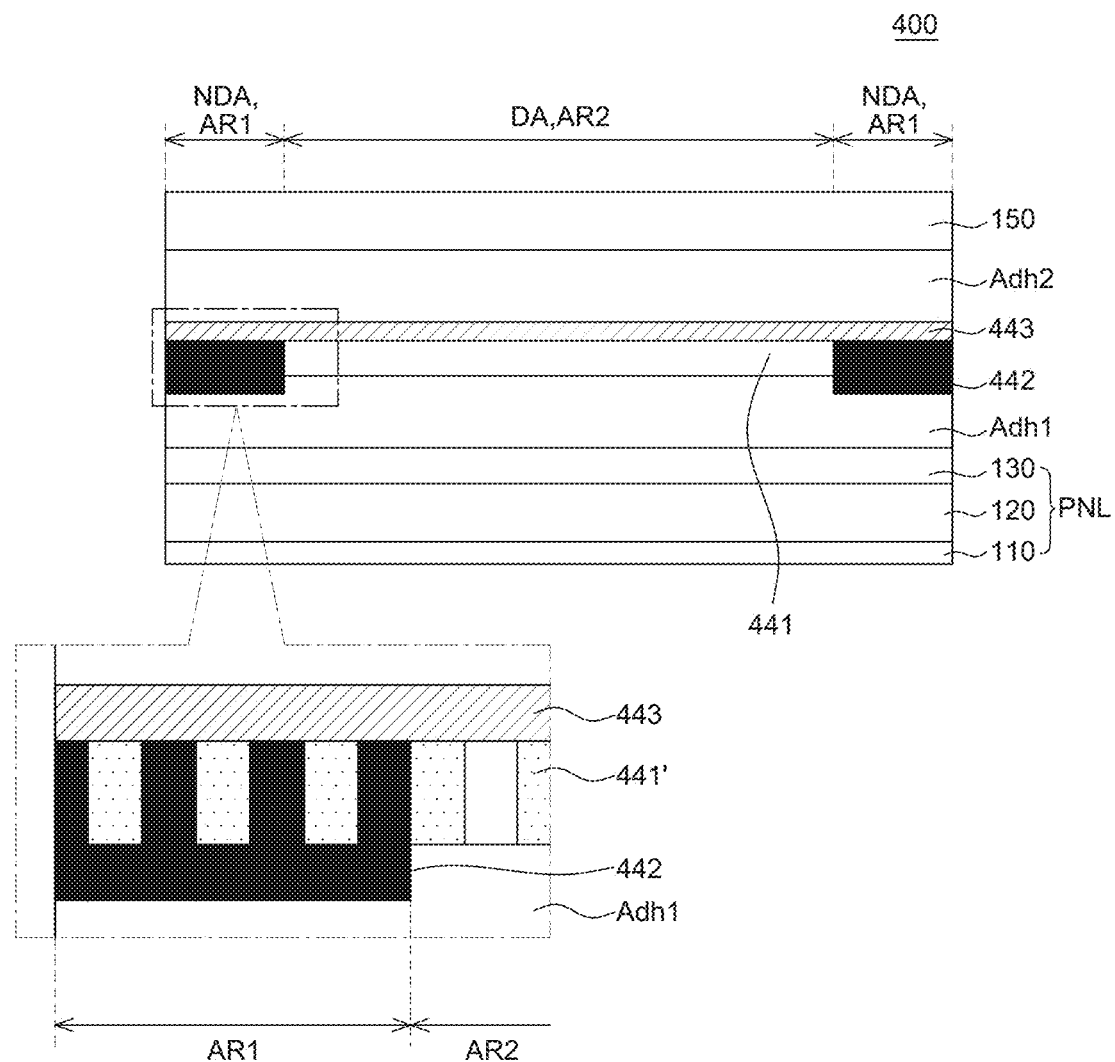
FIG. 5 is a schematic cross-sectional view of a display device according to still another exemplary embodiment of the present disclosure.

FIG. 5 is a schematic cross-sectional view of a display device according to still another exemplary embodiment of the present disclosure.

Referring to FIG. 5, a display device 400 according to still another exemplary embodiment of the present disclosure includes a display panel PNL, a first adhesive layer Adh1, a decorative film 440, a second adhesive layer Adh2, and a cover member 150. The display device 400 illustrated in FIG. 5 is substantially the same as the display device 100 illustrated in FIG. 3 except that the decorative film 400 further includes a base layer 443, so that a redundant description will be omitted or may be briefly provided.

The decorative film 440 includes a porous layer 441, a decorative layer 442, and the base layer 443.

The porous layer 441 can be a non-woven layer 441' formed of one or more polymers selected from polyethylene terephthalate, polyimide, polyamideimide, polycarbonate, polymethyl methacrylate, and cycloolefin (co)polymer.

The base layer 443 can be a film including one or more polymers selected from polyethylene terephthalate, polyimide, polyamideimide, polycarbonate, polymethyl methacrylate, cycloolefin (co)polymer, and cycloolefin polymer. The base layer 443 can be equal to or different from the polymer which configures the porous layer 441.

The porous layer 441 can be a layer separately formed on the base layer 443 or can be a layer integrally formed with the base layer 443. For example, after forming a polymer film with a predetermined thickness, when a plurality of grooves is formed by irradiating laser beam so as not to pass through the film, a film in which the base layer 443 and the porous layer 441 are integrated can be manufactured.

The base layer 443 reinforces the strength by the porous layer 442 to improve a mechanical strength of the decorative film 440.

However, in FIG. 5, it is illustrated that the base layer 443 is disposed on a top surface of the decorative layer 442 to be in contact with the second adhesive layer Adh2, but it is not limited thereto. The baser layer 443 can be disposed on a bottom surface of the decorative layer 442 to be in contact with the upper surface of the first adhesive layer Adh1.

Hereinafter, the effects of the present disclosure will be described in more detail with reference to Embodiments and Comparative Embodiments. However, the following Embodiments are set forth to illustrate the present disclosure, but the scope of the disclosure is not limited thereto.

Embodiment 1

A PET non-woven film was prepared and a black ink was subjected to screen printing to be absorbed in a first area of the PET non-woven film and then cured to form a decorative layer with a thickness of 4 µm. The decorative film prepared as described above was bonded to be disposed between the organic light emitting display panel and the cover member using an optical clear adhesive (OCA). The display device manufactured as described above has the same structure as illustrated in FIG. 2.

Comparative Embodiment 1

Figure 6A:
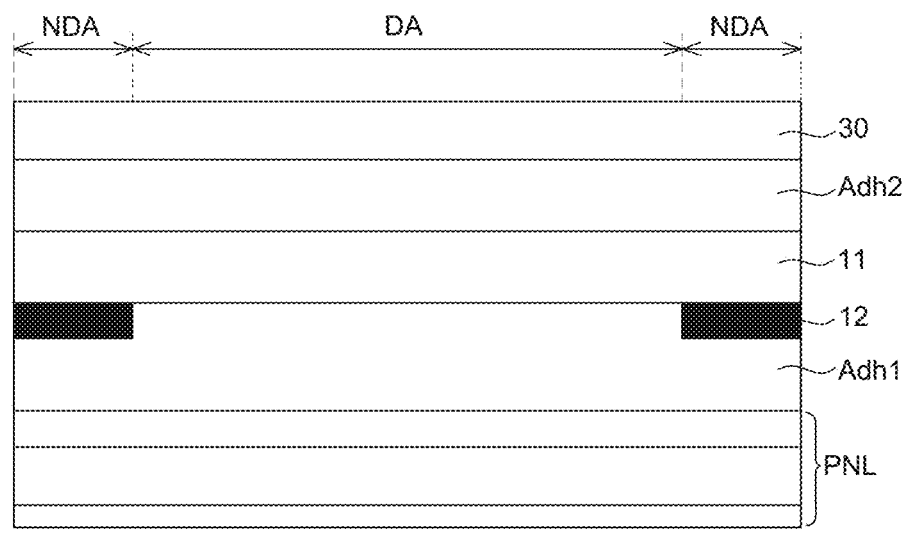
FIG. 6A is a schematic cross-sectional view of a display device according to Comparative Embodiment 1.

A PET film 11 which did not have porosity was prepared and the black ink was subjected to the screen printing on the PET film corresponding to the non-display area to form a decorative layer 12 with a thickness of 4 μm. Except for using the decorative film, the decorative film was disposed between the display panel PNL and the cover member 30 similar to Embodiment 1 to manufacture a display device with a structure illustrated in FIG. 6A.

Comparative Embodiment 2

Figure 6B:
FIG. 6B is a schematic cross-sectional view of a display device according to Comparative Embodiment 2.

After forming the decorative layer 22 on the PET film 11 by the same method as Comparative Embodiment 1, an overcoating layer OC was additionally formed to cover the decorative layer to manufacture a decorative film. Except for using the decorative film, the display device was manufactured by the same method as Comparative Embodiment 1. The display device manufactured as described above has the same structure as illustrated in FIG. 6B.

Experimental Embodiment

A folding reliability of the display device manufactured according to Embodiment 1, Comparative Embodiment 1, and Comparative Embodiment 2 was evaluated. Specifically, in a chamber having a temperature of 60° C. and a relative humidity of 90%, under a condition with a radius of curvature of 4R (a radius of curvature is 4 mm) and a folding speed of 1 Hz, after repeating a process of out-folding and unfolding the display device 50,000 times, the outer appearance was observed to evaluate the folding reliability. The result is illustrated in FIGS. 7, 8, and 9.

Figure 7:
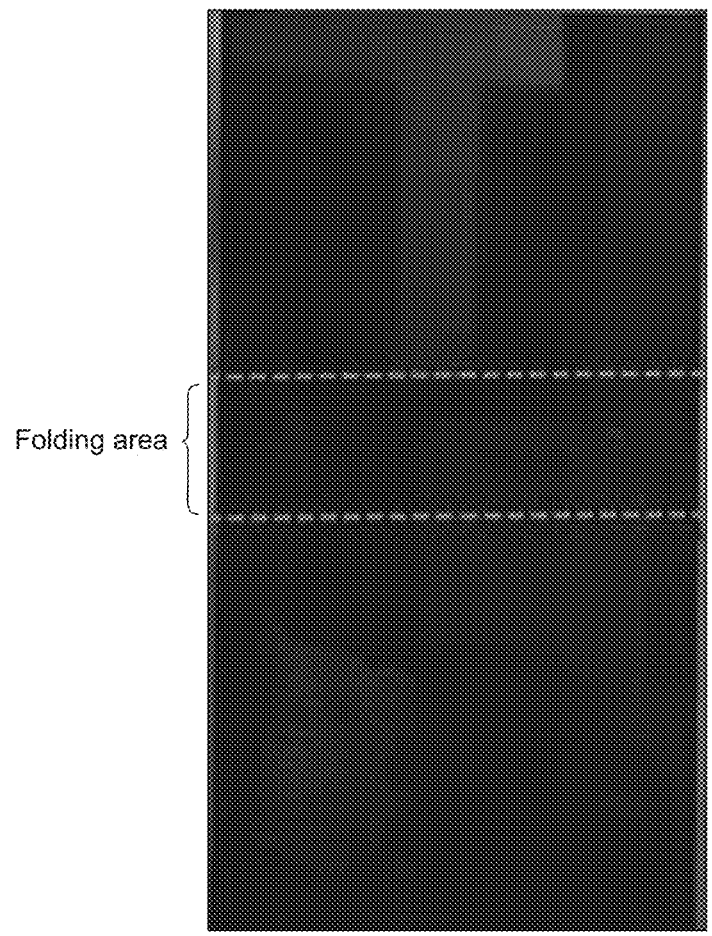
FIG. 7 is a photograph showing an example of a folding reliability evaluation result of a cover member according to Embodiment 1.

FIG. 7 is a photograph showing an example of a folding reliability evaluation result of a display device according to Embodiment 1. FIG. 8 is a photograph showing an example of a folding reliability evaluation result of a display device according to Comparative Embodiment 1. FIG. 9 is a photograph showing an example of a folding reliability evaluation result of a display device according to Comparative Embodiment 2.

Figure 8:
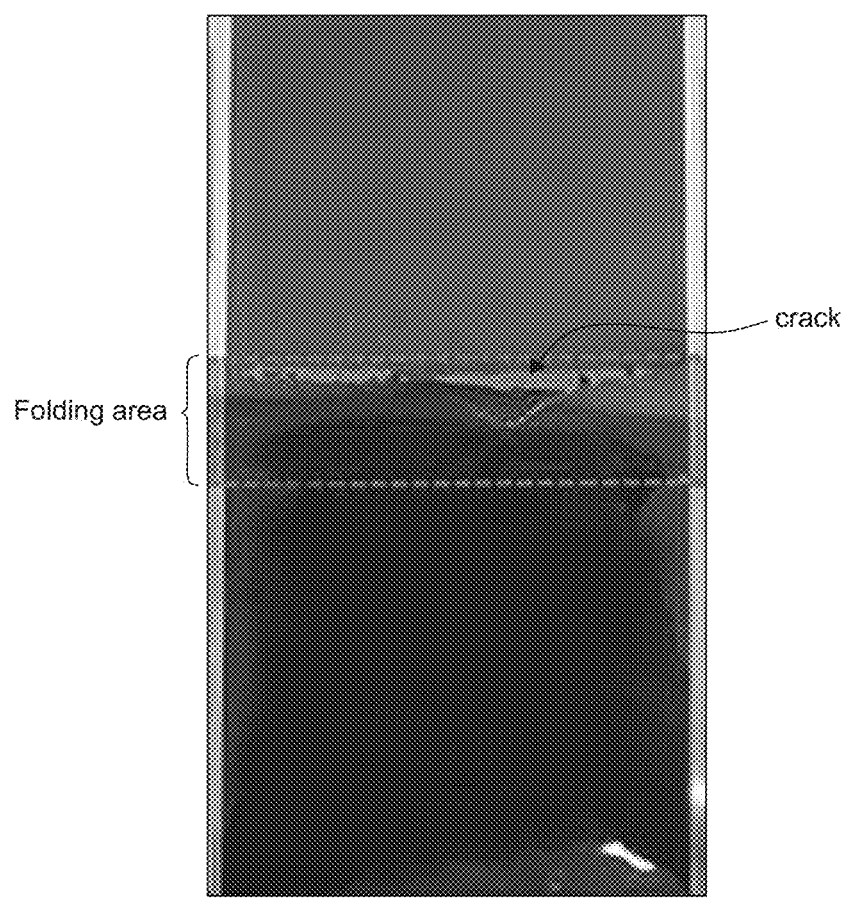
FIG. 8 is a photograph showing an example of a folding reliability evaluation result of a cover member according to Comparative Embodiment 1.
Figure 9:
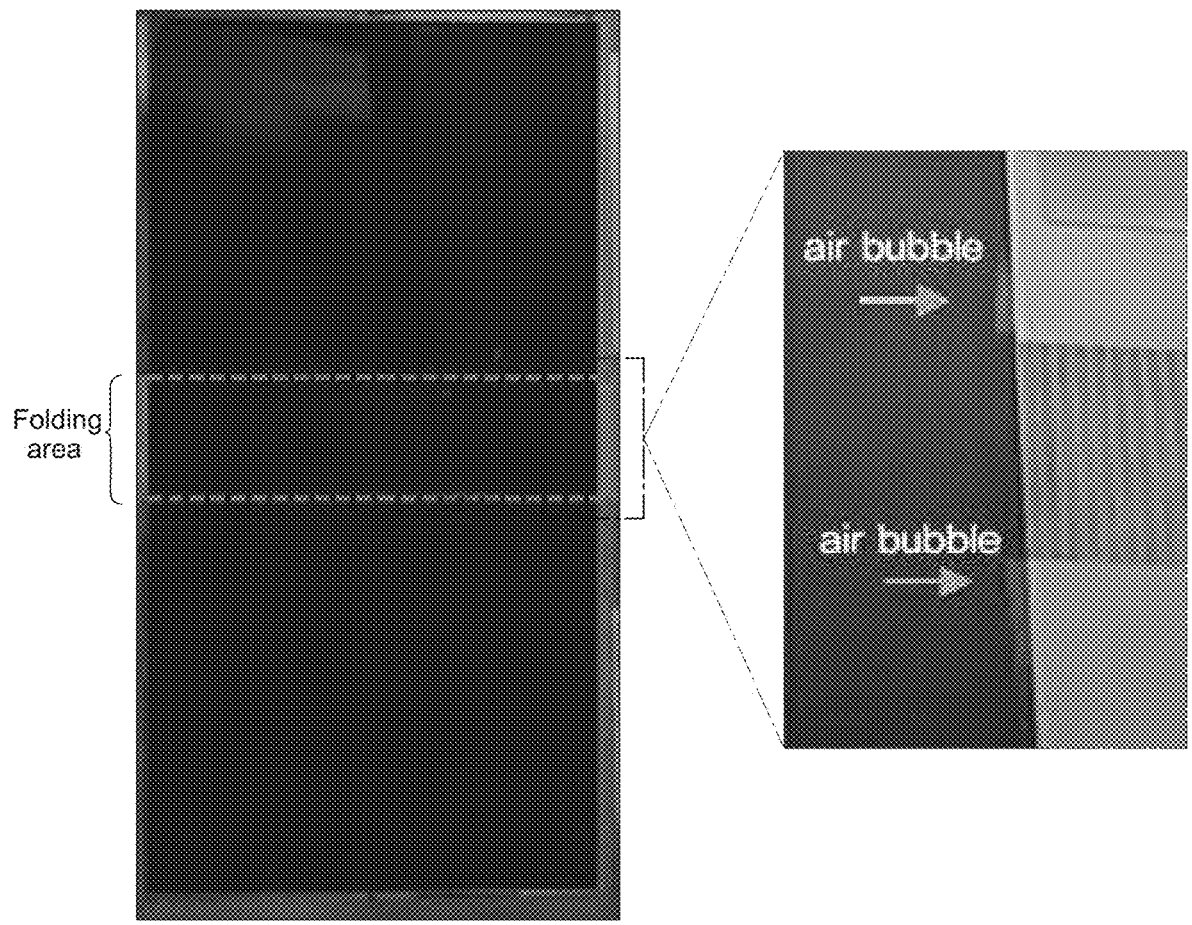
FIG. 9 is a photograph showing an example of a folding reliability evaluation result of a cover member according to Comparative Embodiment 2.

Referring to FIGS. 7 to 9, in the display device according to Embodiment 1, it can be confirmed that the appearance defects such as a crack or bubbles are not observed after the folding reliability evaluation, in contrast, the appearance defects are found from the display device according to Comparative Embodiments 1 and 2.

Specifically, it can be confirmed that in the display device according to the comparative Embodiment 1, the crack is generated in the cover member in the folding area due to the folding stress. This can be considered as a result of a high stress applied to the display device during the folding due to the step of the decorative layer and the entire increased thickness of the display device as the decorative layer is formed on the PFT film.

Further, in the display device according to Comparative Embodiment 2, the overcoating layer is formed on the decorative layer to cover the step so that the crack is not generated in the cover member, however, it can be confirmed that the step is not completely covered so that bubbles are generated in the step portion.

Unlike this, it can be confirmed that in the display device according to Embodiment 1, the black ink is absorbed in the PET non-woven film to form the decorative layer without having a step so that the folding stress is relieved to satisfy the folding reliability.

The exemplary embodiments of the present disclosure can also be described as follows:

According to an aspect of the present disclosure, a display device includes a display panel which includes a display area and a non-display area enclosing the display area; and a decorative film disposed on the display panel, wherein the decorative film includes a porous layer including a plurality of pores and including a first area overlapping the non-display area and a second area overlapping the display area, and a decorative layer disposed in the second area of the porous layer.

An average diameter of the plurality of pores can be 0.01 μm to 50 μm.

An average porosity of the porous layer can be 20 volume % to 80 volume %

The porous layer can be a mesh pattern layer, a foam layer, a woven layer, or a non-woven layer which is formed of one or more polymers selected from polyethylene terephthalate, polyimide, polyamideimide, polycarbonate, polymethyl methacrylate, and cycloolefin (co)polymer.

The non-woven layer and the woven layer can be configured by fibers having a diameter of 0.01 μm to 50 μm.

The decorative film can further include a base layer disposed on one surface of the porous layer.

The base layer can include one or more polymers selected from polyethylene terephthalate, polyimide, polyamideimide, polycarbonate, polymethyl methacrylate, and cycloolefin (co)polymer.

The decorative layer can be formed by immersing a composition for forming the decorative layer in the second area of the porous layer and then curing the composition and can be disposed to be filled in a plurality of pores of the porous layer.

An average diameter of the plurality of pores of the first area can be larger than an average diameter of the plurality of pores of the second area.

An average porosity of the first area can be larger than an average porosity of the second area.

A thickness of the porous layer can be 10 μm to 200 μm.

A thickness of the decorative layer can be 1 μm to 20 μm.

The display device can further comprise an adhesive layer disposed on at least one surface of the porous layer.

A modulus of the adhesive layer can be $1.0 \times 10^3$ Pa to $1.0 \times 10^7$ Pa.

The adhesive layer can be filled in at least some of the plurality of pores.

Although the exemplary embodiments of the present disclosure have been described in detail with reference to the accompanying drawings, the present disclosure is not limited thereto and can be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto.

Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A display device, comprising:
   a display panel including a display area and a non-display area adjacent to the display area; and a decorative film disposed on the display panel,
wherein the decorative film includes:
a porous layer including a plurality of pores, a first area overlapping the non-display area, and a second area overlapping the display area; and
a decorative layer disposed in the first area of the porous layer.

2. The display device according to claim 1, wherein an average diameter of the plurality of pores is approximately 0.01 µm to 50 µm.

3. The display device according to claim 1, wherein an average porosity of the porous layer is approximately 20 volume % to 80 volume %.

4. The display device according to claim 1, wherein the porous layer is a mesh pattern layer, a foam layer, a woven layer, or a non-woven layer which is formed of one or more polymers selected from polyethylene terephthalate, polyimide, polyamideimide, polycarbonate, polymethyl methacrylate, and cycloolefin (co)polymer.

5. The display device according to claim 4, wherein the non-woven layer and the woven layer are configured by fibers having a diameter of approximately 0.01 µm to 50 µm.

6. The display device according to claim 1, wherein the decorative film further includes a base layer disposed on one surface of the porous layer.

7. The display device according to claim 6, wherein the base layer includes one or more polymers selected from polyethylene terephthalate, polyimide, polyamideimide, polycarbonate, polymethyl methacrylate, and cycloolefin (co)polymer.

8. The display device according to claim 1, wherein the decorative layer is formed by immersing a composition for forming the decorative layer in the first area of the porous layer and then curing the composition, and
the decorative layer is disposed to be filled in the plurality of pores of the porous layer.

9. The display device according to claim 1, wherein an average diameter of the plurality of pores of the first area in the porous layer is larger than an average diameter of the plurality of pores of the second area in the porous layer.

10. The display device according to claim 1, wherein an average porosity of the first area in the porous layer is larger than an average porosity of the second area in the porous layer.

11. The display device according to claim 1, wherein a thickness of the porous layer is approximately 10 µm to 200 µm.

12. The display device according to claim 1, wherein a thickness of the decorative layer is approximately 1 µm to 20 µm.

13. The display device according to claim 1, further comprising:
an adhesive layer disposed on at least one surface of the porous layer.

14. The display device according to claim 13, wherein a modulus of the adhesive layer is approximately $1.0 \times 10^3$ Pa to $1.0 \times 10^7$ Pa.

15. The display device according to claim 13, wherein the adhesive layer is filled in at least some of the plurality of pores in the porous layer.

16. The display device according to claim 1, wherein portions of the decorative layer extend into the porous layer.

17. The display device according to claim 1, wherein an upper surface of the decorative layer contacts the porous layer, and
wherein a lowermost surface of the decorative layer is flush with a lowermost surface of the porous layer.

18. The display device according to claim 1, further comprising:
an adhesive layer disposed on a surface of the porous layer,
wherein a portion of the decorative layer extends into a depression in the porous layer, and another portion of the decorative layer extends into a depression in the adhesive layer.

19. The display device according to claim 1, wherein the porous layer includes a plurality of holes that extend all the way through opposite sides of the porous layer, and
wherein the decorative layer at least partially fills some of the plurality of holes in the porous layer.

20. A display device, comprising:
a display panel including a display area and a non-display area adjacent to the display area; and
a decorative film disposed on the display panel,
wherein the decorative film includes:
a porous layer including a plurality of pores, a first area overlapping the non-display area, and a second area overlapping the display area; and
a decorative layer disposed in the first area of the porous layer, and
wherein an average diameter of the plurality of pores of the first area in the porous layer is larger than an average diameter of the plurality of pores of the second area in the porous layer, or an average porosity of the first area in the porous layer is larger than an average porosity of the second area in the porous layer.

* * * * *